(12) United States Patent
Ahssini et al.

(10) Patent No.: US 11,605,404 B2
(45) Date of Patent: Mar. 14, 2023

(54) POWER CIRCUIT THAT INTERRUPTS SUPPLY OF POWER TO A VOLATILE MEMORY IN RESPONSE TO A SIGNAL INDICATING A MALFUNCTION OF A PROCESSOR

(71) Applicant: PROTON WORLD INTERNATIONAL N.V., Diegem (BE)

(72) Inventors: Youssef Ahssini, Vilvoorde (BE); Guy Restiau, Ramillies (BE)

(73) Assignee: Proton World International N.V., Diegem (BE)

(*) Notice: Subject to any disclaimer, the term of this patent is extended or adjusted under 35 U.S.C. 154(b) by 123 days.

(21) Appl. No.: 16/840,178

(22) Filed: Apr. 3, 2020

(65) Prior Publication Data

US 2020/0321035 A1  Oct. 8, 2020

(30) Foreign Application Priority Data

Apr. 8, 2019 (FR) ...................... 1903748

(51) Int. Cl.
  *G11C 5/14* (2006.01)
  *H03K 3/78* (2006.01)
  *G11C 11/4074* (2006.01)
  *G11C 11/406* (2006.01)
  *G11C 11/4076* (2006.01)

(52) U.S. Cl.
  CPC ............ *G11C 5/147* (2013.01); *G11C 5/148* (2013.01); *G11C 11/406* (2013.01); *G11C 11/4074* (2013.01); *G11C 11/4076* (2013.01); *G11C 11/40615* (2013.01); *G11C 11/40626* (2013.01); *H03K 3/78* (2013.01)

(58) Field of Classification Search
  CPC ........ G11C 5/147; G11C 5/148; G11C 11/406; G11C 11/40615; G11C 11/40626; G11C 11/4074; G11C 11/4076; G11C 7/24; G11C 11/407; H03K 3/78
  See application file for complete search history.

(56) References Cited

U.S. PATENT DOCUMENTS

| | | | | |
|---|---|---|---|---|
| 5,027,327 A | * | 6/1991 | Kobayashi | G11C 11/406 365/222 |
| 5,430,681 A | * | 7/1995 | Sugawara | G11C 5/141 365/222 |
| 5,495,452 A | * | 2/1996 | Cha | G11C 11/406 365/222 |
| 7,139,937 B1 | * | 11/2006 | Kilbourne | G11C 11/406 714/47.2 |
| 7,286,377 B1 | * | 10/2007 | Pyeon | G11C 11/40626 365/22 |
| 9,412,434 B1 | * | 8/2016 | Ko | G11C 11/40611 |
| 2001/0036117 A1 | * | 11/2001 | Mullarkey | G11C 11/406 365/222 |

(Continued)

FOREIGN PATENT DOCUMENTS

| | | | | |
|---|---|---|---|---|
| CN | 114255791 A | * | 3/2022 | ............... G06F 1/26 |
| EP | 0 715 311 A2 | | 6/1996 | |

*Primary Examiner* — Mushfique Siddique
(74) *Attorney, Agent, or Firm* — Seed IP Law Group LLP

(57) ABSTRACT

The present description relates to a method and a circuit for powering a volatile memory in which power pulses are sent to the memory, the duration between two pulses being shorter than a remanence time of said volatile memory.

11 Claims, 2 Drawing Sheets

(56) References Cited

U.S. PATENT DOCUMENTS

2007/0097677 A1* 5/2007 Oh .................. G11C 11/406
  362/222
2013/0326206 A1* 12/2013 Lueck .................. G06F 1/32
  713/1

* cited by examiner

POWER CIRCUIT THAT INTERRUPTS SUPPLY OF POWER TO A VOLATILE MEMORY IN RESPONSE TO A SIGNAL INDICATING A MALFUNCTION OF A PROCESSOR

BACKGROUND

Technical Field

The present description generally relates to electronic circuits, and more particularly circuits making it possible to supply power to other electronic circuits, for example, a memory circuit.

Description of the Related Art

In general, an electronic device, comprising several electronic circuits, comprises one or more power circuits suitable for powering said circuits composing it. The supply of each of these circuits can be done in a different manner. As an example, some circuits use a continuous power supply, while other circuits, for example, use a periodic power supply. One drawback of a continuous power supply is that it is costly in terms of energy.

Memory circuits, or memories, are circuits configured to store data; several types exist. Certain memories, non-volatile memories, are configured to store data when they are not supplied with energy, while others, volatile memories, receive a continuous supply of power to store data. Volatile memories are therefore very costly memories in terms of energy.

It would be desirable to be able to improve, at least in part, certain aspects of the known power circuits, and more particularly certain aspects of the known power circuits of memory circuits.

BRIEF SUMMARY

One or more embodiments of the present application provide better performing power circuits and memory circuits with lower energy consumption.

One embodiment offsets all or some of the known drawbacks of the known power circuits, and more particularly certain aspects of the known power circuits of memory circuits.

One embodiment provides a power circuit of a volatile memory in which power pulses are sent to the memory, the duration between two pulses being shorter than a remanence time of said volatile memory.

One embodiment provides a power supply method of a volatile memory in which power pulses are sent to the memory, the duration between two pulses being shorter than a remanence time of said volatile memory.

According to one embodiment, the volatile memory is a dynamic volatile memory.

According to one embodiment, said duration is between 55 and 75% of the remanence time.

According to one embodiment, the pulses are periodic.

According to one embodiment, the pulses have a duration on the order of 100 nanoseconds.

According to one embodiment, the duration between two pulses is adjusted by a processor.

According to one embodiment, a memory of the processor contains the remanence time of the volatile memory.

According to one embodiment, a signal indicating a malfunction of the processor interrupts the power supply of the volatile memory.

According to one embodiment, the remanence time of the volatile memory is the duration during which data stored in the memory are kept after stopping a power supply of the memory.

One embodiment provides a device comprising:
a processor;
a volatile memory; and
a power circuit of the memory.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the general operation of a memory, and more particularly of a volatile memory, will not be described hereinafter.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless otherwise specified, the expressions "around", "approximately", "substantially" and "on the order of" mean to within 10%, preferably to within 5%.

Figure 1:
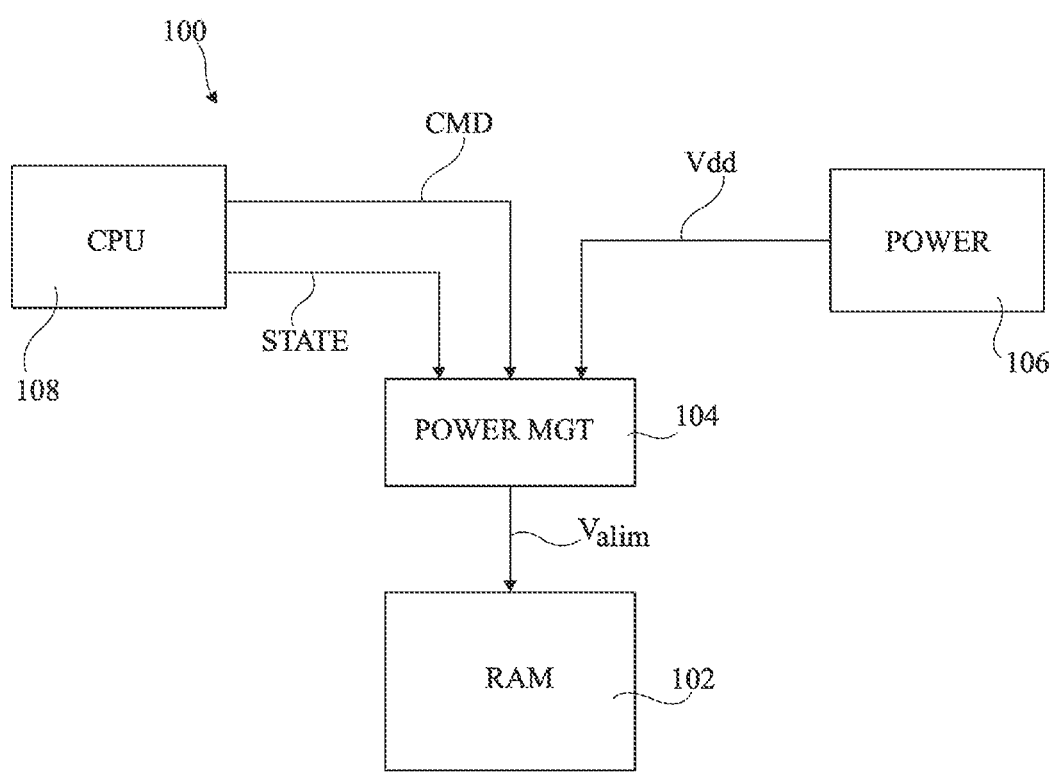
FIG. 1 shows, very schematically and in block form, part of an embodiment of an electronic device.

FIG. 1 shows, very schematically and in block form, an electronic device 100 according to one embodiment.

The device 100 comprises:
a volatile memory 102 (RAM); and
a power circuit 104 (POWER MGT) for managing the volatile memory 102;
a power source 106 (POWER); and
a processor 108 (CPU).

The volatile memory 102, random-access memory (RAM), is a memory that receives power from a power source to store data. Once the power source is cut, the data stored in the volatile memory 102 are no longer accessible; they are generally lost and/or erased. However, the loss of these data is not instantaneous; after the power is cut, the data stored in the volatile memory 102 are still present for a period, called remanence time Tr, which is the time for all of the charges to disappear from the memory circuit by leakage. According to the volatile memory models, the remanence time Tr can, for example, be on the order of 500 nanoseconds to 1 millisecond at ambient temperature and reach up to 30 milliseconds at a temperature of −40° C.

In the described embodiments, advantage is taken of what can be compared to a defect or artifact of the volatile memory, namely the remanence of the information, so as only to power the memory discontinuously. The remanence time is determined for a given type, category or model of volatile memory, by simulation and/or in situ measurements, etc.

The remanence time Tr originates from a feature of volatile memories. The memory 102 is characterized in that its remanence time Tr has been calculated. As an example, the volatile memory is a dynamic volatile memory, for example, of the DRAM (Dynamic Random Access Memory) type.

According to the described embodiment, the volatile memory 102 receives a power signal Valim from the power circuit 104. The volatile memory further receives control signals, for example, read and/or write signals, but they are not shown or described here.

The power circuit 104 is a circuit configured to provide the power signal Valim to the memory 102. The power circuit 104 receives:

a control signal CMD from the processor 108;
a state signal STATE, which may indicate a malfunction of the processor 108, from the processor 108; and
a DC voltage Vdd from the power source 106.

The power source 106 is a continuous power source. As an example, the power source can be a main power circuit of the device.

The processor 108 is, for example, a processor included in the device and distinct from the circuit 104.

The operation of the part 100 of the device, and the signals Valim, CMD and STATE, will be described hereinafter.

Figure 2:
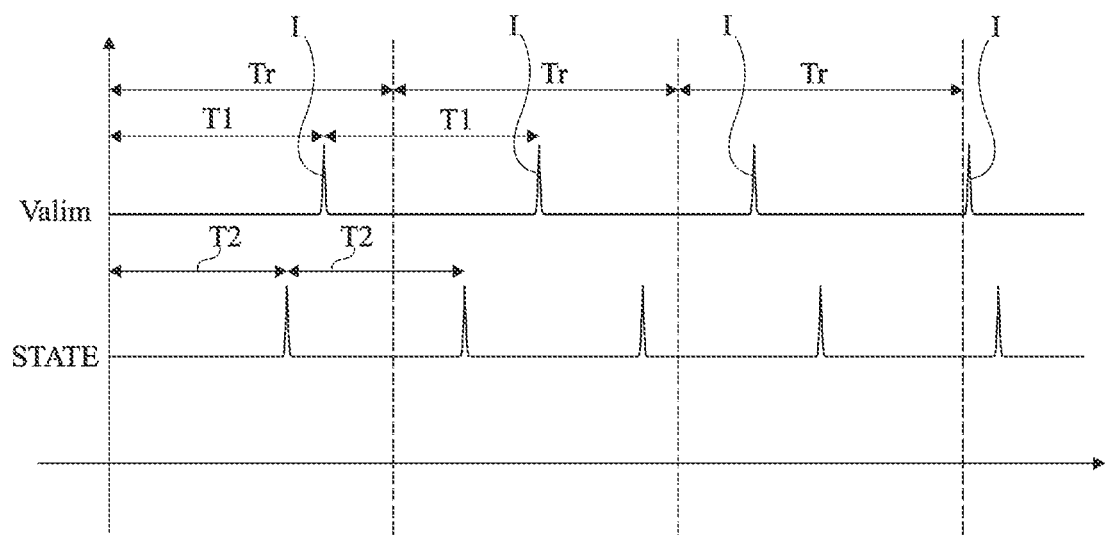
FIG. 2 shows a timing diagram illustrating power and control signals.

FIG. 2 is a timing diagram illustrating the evolution of the signals Valim and STATE described in connection with FIG. 1.

The signal Valim is a power signal comprising power pulses I separated by a duration T1. The power pulses I are, for example, voltage pulses and/or current pulses. According to one embodiment (shown in FIG. 2), the pulses I are spaced apart periodically by the duration T1. The duration T1 is shorter than the remanence time Tr of the volatile memory 102. As an example, the duration T1 is equal to about 55 to 75% of the remanence time Tr. Each pulse I has a duration sufficient to provide the memory 102 with power to keep the data that it stores. As an example, the pulses I have a duration, for example, of between 100 and 200 nanoseconds. As an example, the duration of the pulses I is adjusted by the power circuit 104.

The state signal STATE is a signal indicating a malfunction of the processor 108 to the power circuit 104. When the processor is working correctly, the state signal STATE has no influence over the power of the memory 102. However, when the processor 104 does not work correctly, for example, when it is the victim of a malicious attack, the state signal STATE controls the power circuit 104 to cut the power supply of the memory 102, such that the data that it stores are no longer accessible.

According to the embodiment illustrated in FIG. 2, the state signal STATE is an analog signal comprising power pulses spaced regularly apart, for example, periodically, by a duration T2. According to this example, the duration T2 is shorter than the duration T1, such that when the operating frequency of the processor decreases, for example, during a malicious attack, the duration T2 exceeds the duration T1, which would be a sign of attack of the processor 108 for the power circuit 104.

As a variant, the state signal STATE is an analog signal having a different form from that previously described. According to another variant, the state signal STATE can be a digital signal.

The operation of the part 100 of the device described in connection with FIG. 1, and a method for supplying power to the memory 102, are as follows.

The processor 108 knows the remanence time Tr of the memory 102, for example, including a memory in which the remanence time is stored, and indicates, to the power circuit 104, via the control signal CMD, the duration T1 between the pulses of the power signal Valim. In other words, the processor 108 sets or adjusts the duration T1. The control signal CMD can be an analog signal or a digital signal. The power circuit 104 further receives the state signal STATE, allowing it to be alerted in case of operating problem and/or attack of the processor 108. The power circuit 104 generates the signal Valim, from the DC voltage Vdd received from the power source 106, and the control signal CMD. As previously stated, the signal Valim is configured to power the memory 102 by power pulses before the remanence time Tr has elapsed so that the memory 102 does not lose the data that it stores.

One advantage of this embodiment is that the volatile memory 102 is no longer powered by a continuous power supply, but by a periodic power supply that is less costly in terms of energy.

Another advantage of this embodiment is, for example, in case of attack of the device, that the erasure of data stored in the memory 102 is faster than when the memory 102 is powered continuously. Indeed, the actual time taken by the memory 102 to lose/erase the data that it stores is less than or equal to its remanence time Tr. More particularly, when the power supply of the memory 102 is cut after a pulse I arrives, the loss time of the data is equal to the remanence time, but when the power supply is cut later, the loss time of the data is therefore shorter than the remanence time Tr, since it is the last pulse I received by the memory 102 that serves as the starting point for the remanence time.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

storing data in a dynamic random access memory, a remanence time of the dynamic random access memory being a time during which the data are kept in the dynamic random access memory after a supply of power to the dynamic random access memory is stopped;

outputting, with a processor, a state signal including a plurality of first power pulses, wherein a first separation time between the first power pulses indicates whether or not the processor is in a malfunction state;

sending, with a power circuit, a plurality of second power pulses to the dynamic random access memory, consecutive pulses of the plurality of second power pulses being separated by a second separation time that is shorter than the remanence time of the dynamic random access memory;

receiving the state signal with the power circuit; and interrupting the supply of the second power pulses to the dynamic random access memory in response to the first separation time of the first power pulses of the state signal from the processor being larger than the second separation time, wherein the second separation time is between 55 and 75% of the remanence time.

2. The method of claim 1, wherein the second power pulses are periodic.

3. The method of claim 1, wherein the second separation time is approximately 100 nanoseconds.

4. A method comprising:

sending, from a processor to a power circuit, a state signal including a plurality of first power pulses, wherein a first separation time between the first power pulses indicates whether or not the processor is in a malfunction state;

powering a dynamic random access memory that stores data by sending a plurality of second power pulses from the power circuit to the dynamic random access memory, a remanence time of the dynamic random access memory being a time during which the data are kept in the dynamic random access memory after a supply of power to the dynamic random access memory is stopped, and consecutive power pulses of the plurality of second power pulses being separated by a second separation time that is shorter than the remanence time of said dynamic random access memory; and interrupting the supply of the second power pulses to the dynamic random access memory in response to the first separation time being larger than the second separation time, wherein the second separation time is between 55 and 75% of the remanence time.

5. The method according to claim 4, wherein a memory of the processor stores the remanence time of the dynamic random access memory, and the processor controls the second separation times of the second power pulses based on the stored remanence time.

6. The method according to claim 4, wherein the second pulses are periodic.

7. The method according to claim 4, wherein the second pulses have a duration of approximately 100 nanoseconds.

8. A method, comprising:

storing data in a dynamic random access memory;

outputting, with a processor, a state signal including a plurality of first power pulses, wherein a first separation time between the first power pulses indicates whether or not the processor is in a malfunction state;

storing in a memory of the processor, a remanence time of the dynamic random access memory; and sending, with a power circuit, a plurality of second power pulses to the dynamic random access memory, consecutive pulses of the plurality of second power pulses being separated by a second separation time that is shorter than the remanence time of the dynamic random access memory; and interrupting the supply of the second power pulses to the dynamic random access memory in response to the first separation time being larger than the second separation time, wherein the second separation time is between 55 and 75% of the remanence time.

9. The method of claim 8, wherein the processor controls the duration between the consecutive second power pulses based on the stored remanence time.

10. The method of claim 8, wherein the second pulses are periodic.

11. The method of claim 8, wherein the second separation time is approximately 100 nanoseconds.

* * * * *

UNITED STATES PATENT AND TRADEMARK OFFICE
CERTIFICATE OF CORRECTION

PATENT NO. : 11,605,404 B2
APPLICATION NO. : 16/840178
DATED : March 14, 2023
INVENTOR(S) : Youssef Ahssini et al.

Page 1 of 1

It is certified that error appears in the above-identified patent and that said Letters Patent is hereby corrected as shown below:

In the Claims

Column 6, Claim 8, Line 24:
"storing in a memory" should be: -- storing, in a memory --.

Signed and Sealed this
Twenty-third Day of May, 2023

Katherine Kelly Vidal
*Director of the United States Patent and Trademark Office*